(12) United States Patent
Blackmon et al.

(10) Patent No.: US 6,505,306 B1
(45) Date of Patent: Jan. 7, 2003

(54) REDUNDANT BIT STEERING MECHANISM WITH DELAYED SWITCHOVER OF FETCH OPERATIONS DURING REDUNDANT DEVICE INITIALIZATION

(75) Inventors: Herman Lee Blackmon, Rochester, MN (US); Robert Allen Drehmel, Goodhue, MN (US); Kent Harold Haselhorst, Byron, MN (US); James Anthony Marcella, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/396,973

(22) Filed: Sep. 15, 1999

(51) Int. Cl.[7] .................................................. H02H 3/05
(52) U.S. Cl. ............................................. 714/6; 714/42
(58) Field of Search ................... 714/6, 42, 13, 714/7, 710, 723, 764, 767

(56) References Cited

U.S. PATENT DOCUMENTS

| | | | | |
|---|---|---|---|---|
| 4,608,687 A | * | 8/1986 | Dutton | 714/6 |
| 4,899,342 A | * | 2/1990 | Potter et al. | 714/6 |
| 5,267,242 A | * | 11/1993 | Lavallee et al. | 714/7 |
| 5,469,453 A | * | 11/1995 | Glider et al. | 714/6 |
| 5,493,508 A | * | 2/1996 | Dangelo et al. | 716/5 |
| 5,611,069 A | * | 3/1997 | Matoba | 711/114 |
| 5,659,678 A | * | 8/1997 | Aichelmann et al. | 714/25 |
| 6,192,485 B1 | * | 2/2001 | Takita et al. | 714/25 |
| 6,351,427 B1 | * | 2/2002 | Brown | 365/189.05 |

OTHER PUBLICATIONS

Dell, Timothy, J., *A White Paper on the Benefits of Chipkill–Correct ECC for PC Server Main Memory*, International Business Machines Corp., IBM Microelectronics Division, (Nov. 19, 1997), pp. 1–23.

"Fault Tolerance Decision in DRAM Applications", International Business Machines Corp., (Jul. 1997), pp. 1–2.

* cited by examiner

Primary Examiner—Robert Beausoleil
Assistant Examiner—Yolanda Wilson
(74) Attorney, Agent, or Firm—Wood, Herron & Evans

(57) ABSTRACT

An apparatus, program product and method initialize a redundant memory device by delaying the switchover of non-initialization fetch operations from a failed memory device to the redundant memory device until after initialization of the redundant memory device is complete. Consequently, during initialization, the non-initialization fetch operations are directed to the failed memory device, while non-initialization store operations are directed to the redundant device.

21 Claims, 4 Drawing Sheets

REDUNDANT BIT STEERING MECHANISM WITH DELAYED SWITCHOVER OF FETCH OPERATIONS DURING REDUNDANT DEVICE INITIALIZATION

FIELD OF THE INVENTION

The invention is generally related to data processing systems such as computers and like electronic devices, and more particularly, to error detection and correction in a memory array implemented in a data processing system.

BACKGROUND OF THE INVENTION

Ensuring the integrity of data processed by a data processing system such as a computer or like electronic device is critical for the reliable operation of such a system. Data integrity is of particular concern, for example, in fault tolerant applications such as servers, databases, scientific computers, and the like, where any errors whatsoever could jeopardize the accuracy of complex operations and/or cause system crashes that affect large numbers of users.

Data integrity issues are a concern, for example, for many solid state memory arrays such as those used as the main working storage repository for a data processing system. Solid state memory arrays are typically implemented using multiple integrated circuit memory devices such as static or dynamic random access memory (SRAM or DRAM) devices. Such devices may be subject to a number of errors throughout their lifetimes, including what are referred to as "hard" and "soft" errors.

A hard error is generally a permanent failure of all or a portion of a memory device, typically due to a latent defect during manufacturing or some electrical disturbance that occurs during the operation of the device. A hard error, for example, may affect a single memory cell, a row or column of memory cells, an input/output port, or even an entire device. A soft error is generally a transient alteration in the state of data stored in a memory cell, often due to natural effects such as cosmic rays or alpha particles, and can be corrected by shutting down the device and restarting. Despite significant improvements in circuit fabrication technologies, however, no memory device is completely immune from errors, and as such, significant development efforts have been directed at handling such errors in a manner that ensures the continued integrity of the data stored in the memory array.

For example, complex error correction code (ECC) algorithms have been developed to address some of the errors that may arise during the operation of a memory array. Data is typically stored in a memory array in binary form including a plurality of bits arranged together to form logical "words" of data. Most ECC algorithms typically address the situation where a single bit in a word is faulty, an error condition known as a "single bit error". To do so, most ECC algorithms store a separate error correction code along with a word of data, and a complex mathematical algorithm is used to both detect and correct for any single bit error in the word.

ECC algorithms typically cannot address the situation where multiple bits in a word are faulty. However, since single bit errors comprise the vast majority of all errors experienced in a memory array, ECC algorithms do a great deal to improve the data integrity of ECC-capable data processing systems. Moreover, to minimize the likelihood of multi-bit errors (also referred to as unrecoverable errors), many memory arrays arrange memory devices such that each device provides no more than one bit in any given word in the memory address space. Consequently, failure of any given device, or portion thereof, will only cause an unrecoverable error if an error is also present in another device that provides another bit of the same word.

Additional integrity protection may be available through the use of a redundant memory array, in which a portion of the data width in the memory array is reserved for use whenever an error is detected in another portion of the memory array. In systems in which no memory device supplies more than one bit of data for any given word, a failure of a particular device results in a failure in one bit of a word, and a process known as redundant bit steering (RBS) is used to redirect, or "steer" dataflow from the failed bit to a redundant bit allocated in the reserved space of the redundant memory array.

Often, the reserved space in a redundant memory array is allocated on a separate, dedicated memory device, although the reserved space could be allocated in existing devices as well. Regardless, when all or a portion of the addressable space of a device is determined to be faulty, the process of redirecting dataflow from the failed bit to a redundant bit is referred to as "replacing" the failed device with a redundant device, irrespective of the fact that other memory accesses allocated to the failed device may continue to be processed.

Replacing a failed device with a redundant device necessarily requires that the redundant device be initialized with the data from the failed device. The most straightforward manner of doing so would be to simply prohibit access to the memory array, copy the affected data over from the failed device to the redundant device, and then switch over to the redundant device for all future accesses. However, in most fault tolerant applications, it is not possible to prohibit accesses to the memory array for any appreciable amount of time. Consequently, a redundant memory array typically must be capable of handling non-initialization operations concurrently with initialization of a redundant memory device.

For example, one manner of initializing a redundant device while maintaining the availability of the memory array is to simply switch over to the redundant device and allow ECC logic to correct any single bit errors in the redundant bit supplied by the device. Over time, stores to the redundant device would fill the device with correct data. However, without initialization, the initial state of the data in the redundant device at the time of switchover cannot be known, and as such, statistically 50% of all accesses involving the redundant device will require the redundant bit to be corrected. Reliability then becomes a concern with this approach, since for any single-bit error in another memory device, there is roughly a 50% chance that an error in the redundant bit will also occur, resulting in an unrecoverable multi-bit error.

Another approach is to attempt to copy data over from the failed device to the redundant device concurrently with the processing regular store and fetch operations submitted to the memory array, a process known as "cleaning" the redundant device. Data is typically copied over by sequentially fetching segments of data allocated to a failed memory device, passing the data through normal ECC logic, and storing the corrected data segments back into the redundant device. During such operations, however, typically the hardware that substitutes the redundant device for the failed device is controlled such that regular fetch or store operations directed to an uncleaned area of the failed device are directed to the failed device, while operations directed to the cleaned area are directed to the redundant device. In practice, however, such operations are problematic to implement given that the boundary of the cleaned and uncleaned areas is constantly moving, making it difficult to determine whether an access is directed to a cleaned or uncleaned area of a device. These difficulties increase the risk that the failed device will be utilized for accesses to the cleaned area, or that the redundant device will be utilized for accesses to the uncleaned area, introducing potential data integrity concerns. Moreover, the logic required to properly control the dataflow between the failed and redundant devices is more complex, requiring additional hardware and increasing the cost of a memory controller design.

Therefore, a significant need continues to exist in the art for an improved manner of initializing a redundant device in a redundant memory array, and in particular, for an improved manner of initializing a redundant device which provides fast and efficient initialization while maintaining data integrity.

SUMMARY OF THE INVENTION

The invention addresses these and other problems associated with the prior art by providing an apparatus and method of initializing a redundant memory device in which, during initialization of the redundant memory device, the switchover of non-initialization fetch operations to the redundant memory device is delayed until after initialization of the redundant memory device is complete. Consequently, during initialization, the non-initialization fetch operations are directed to the failed memory device, while non-initialization store operations are directed to the redundant device.

Embodiments of the invention utilize operation type-based routing as disclosed herein to take advantage of the fact that, in most situations, the errors that cause a memory device to fail are relatively small when compared to the overall device size, and as such, most of the data is still correct in the failed device. Consequently, by only switching store operations to the redundant device and continuing to direct fetch operations to the failed device while the redundant device is being initialized, fetch operations during the initialization process, which might otherwise introduce single bit errors were they directed to the redundant device as a result of the redundant device not being completely initialized, are instead read from the predominantly correct data stored in the failed device. And with a lower frequency of single bit errors, the likelihood of bit error in another device causing an unrecoverable error that cannot be otherwise corrected is reduced.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
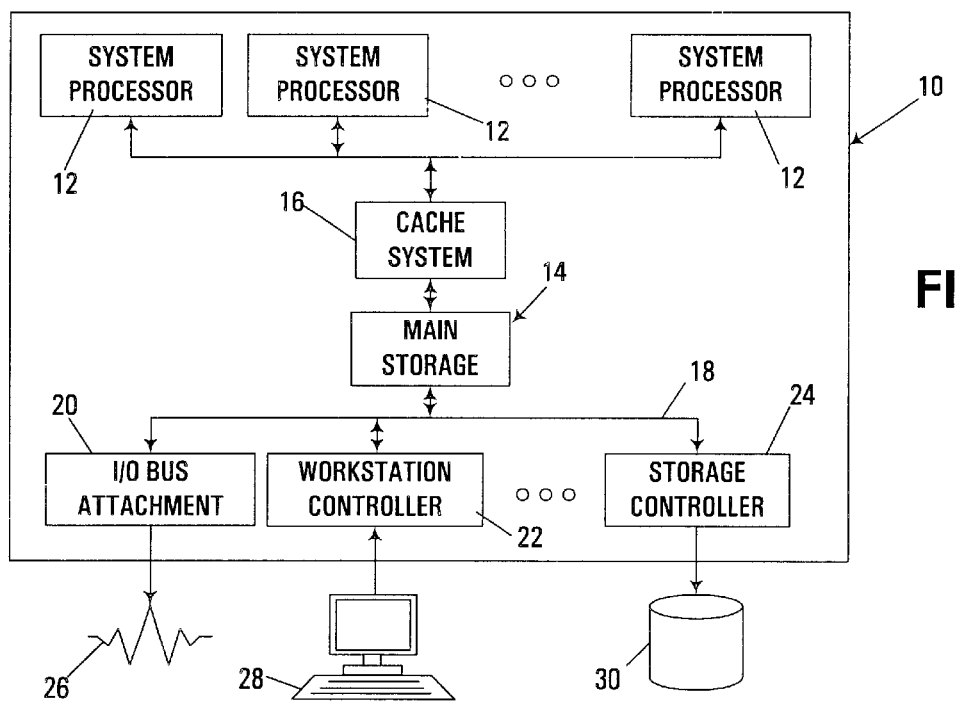
FIG. 1 is a block diagram of a computer system consistent with the invention.

The implementations of the invention discussed below generally improve the reliability and performance of a redundant memory array through the use of a operation type-based routing mechanism that separately directs fetch (read) and store (write) operations associated with an affected portion of redundant memory array during initialization of a redundant memory device. In particular, during initialization, non-initialization fetch operations associated with a failed memory device are still directed to a failed memory device until such time as initialization is complete, while non-initialization store operations are directed to a redundant memory device while initialization is being performed.

By being "directed" to a particular device, what is meant is that data from that device is used in the operation. For example, for a store operation, directing the operation to a failed or redundant device implies that data is actually written to such device. Likewise, directing a fetch operation to a failed or redundant device implies that data from such device is used in the data word returned in response to the operation. However, as will become more apparent below, directing an operation to a particular device does not imply that another device may not also be accessed in the operation. For example, in the implementation described herein, a failed device is still accessed in response to a fetch operation directed to the redundant device, and vice versa, but the data therefrom is simply discarded. Likewise, for a store operation directed to the redundant device, data is still written to the failed device, although the data is never actually used.

A redundant memory array may represent practically any array of addressable memory locations resident in one or more physical memory devices, e.g., dynamic random access memory (DRAM) devices, static random access memory (SRAM) devices, etc. Moreover, as discussed below, a redundant memory device provided in such an array may be a separate device from the primary memory devices implementing the array, or in the alternative, may be embodied in unused or reserved space in one or more of the primary memory devices in the array. In this latter instance, therefore, initialization of a redundant memory device may actually consist of initializing only a redundant portion of the device, while switching over from a failed device to a redundant device may result in other, non-failed portions of the failed device still being used after the switchover is complete.

An operation is considered herein to be associated with a failed memory device whenever at least a failed portion of the device stores at least one bit of information to which the operation is directed. As is well known in the art, often memory devices are partitioned to provide at most one bit of any particular memory address, and as such, a failed memory device will in many instances only supply a single bit of information in response to a memory access operation.

Initialization of a redundant device typically involves copying over at least a portion of the data in a failed memory device into a redundant memory device. In the illustrated implementation, each device is split into a plurality of ECC words, based upon the number of I/O ports on the device (four I/O ports with single bit correct ECC and chip kill capabilities are used in the illustrated embodiment). Also in this implementation a plurality of "extents" or chip select groups may be controlled separately. An extent is a group of devices that are accessed concurrently. Typically, more than one extent will share a data bus with at least one control line that is unique between extents. Moreover, all of the data in a failed extent of a failed device is copied over to a redundant device. However, in other implementations, it may be desirable to only copy over data that is stored in a failed portion of a failed extent of a failed memory device. In other embodiments, the entire contents of a failed device may also be copied over, if appropriate. Of course, in such implementations, the actual data stored in a failed portion may not be retrievable, but may instead be generated from ECC logic, which in this implementation, is functionally equivalent to copying correct data from a failed device to a redundant device.

Turning to the Drawings, wherein like numbers denote like parts throughout the several views, FIG. 1 illustrates the general configuration of an exemplary data processing system 10 suitable for implementing a redundant memory array consistent with the invention. System 10 generically represents, for example, any of a number of multi-user computer systems such as a network server, a midrange computer, a mainframe computer, etc. However, it should be appreciated that the invention may be implemented in other data processing systems, e.g., in stand-alone or single-user computer systems such as workstations, desktop computers, portable computers, and the like, or in other computing devices such as embedded controllers and the like. One suitable implementation of data processing system 10 is in a midrange computer such as the AS/400 computer available from International Business Machines Corporation.

Data processing system 10 generally includes one or more system processors 12 coupled to a memory subsystem including main storage 14, e.g., an array of dynamic random access memory (DRAM). Also illustrated as interposed between processors 12 and main storage 14 is a cache system 16, typically including one or more levels of data, instruction and/or combination caches, with certain caches either serving individual processors or multiple processors as is well known in the art. Moreover, at least some of the caches in cache system 16 may be integrated onto the same integrated circuit devices as one or more of system processors 12. Furthermore, main storage 14 is coupled to a number of types of external devices via a system bus 18 and a plurality of interface devices, e.g., an input/output bus attachment interface 20, a workstation controller 22 and a storage controller 24, which respectively provide external access to one or more external networks 26, one or more workstations 28, and/or one or more storage devices such as a direct access storage device (DASD) 30.

It should be appreciated that data processing system 10 is merely representative of one suitable environment for use with the invention, and that the invention may be utilized in a multitude of other environments in the alternative. For example, in the illustrated embodiment, a redundant memory array is implemented within main storage 14. However, in other implementations, a redundant memory array could be implemented in any of the various levels of cache memory in system 10, or in any other levels of memory such as in a mass storage system coupled to the system locally or via an external network. A redundant memory array could also be implemented within the local storage of any of the various electronic components in system 10, or within practically any memory array found in an electronic device, for which fault tolerance and redundancy is desired. The invention should therefore not be limited to the particular implementations discussed herein.

A redundant memory array consistent with the invention is typically implemented in a circuit arrangement disposed on one or more programmable integrated circuit devices. Moreover, as is well known in the art, integrated circuit devices are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of circuit arrangements implemented in fully functioning integrated circuit devices and data processing systems utilizing such devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 2:
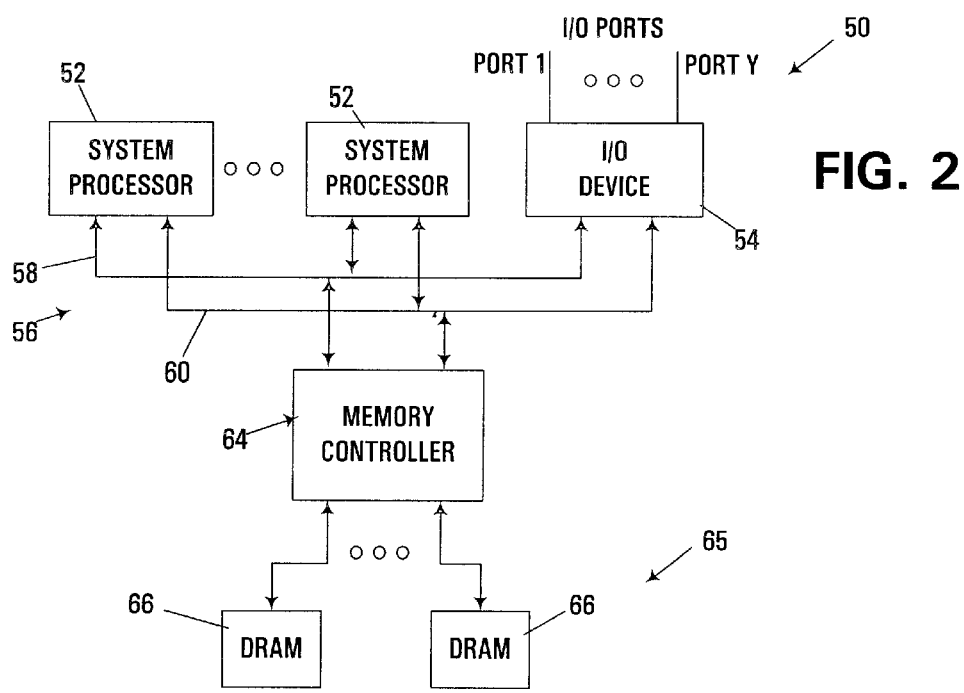
FIG. 2 is a block diagram of the memory interface components in another computer system consistent with the invention.

FIG. 2 next illustrates another data processing system 50 implementing a shared bus architecture through which a redundant memory array is interfaced. A plurality of system processors 52, as well as one or more input/output devices 54 are illustrated as coupled to a shared system bus 56 including an address bus 58 and a data bus 60. Also coupled to bus 56 is a memory controller 64 which interfaces the various components tied to system bus 56 with a redundant memory array 65 including a plurality of DRAM memory devices 66.

Figure 3:
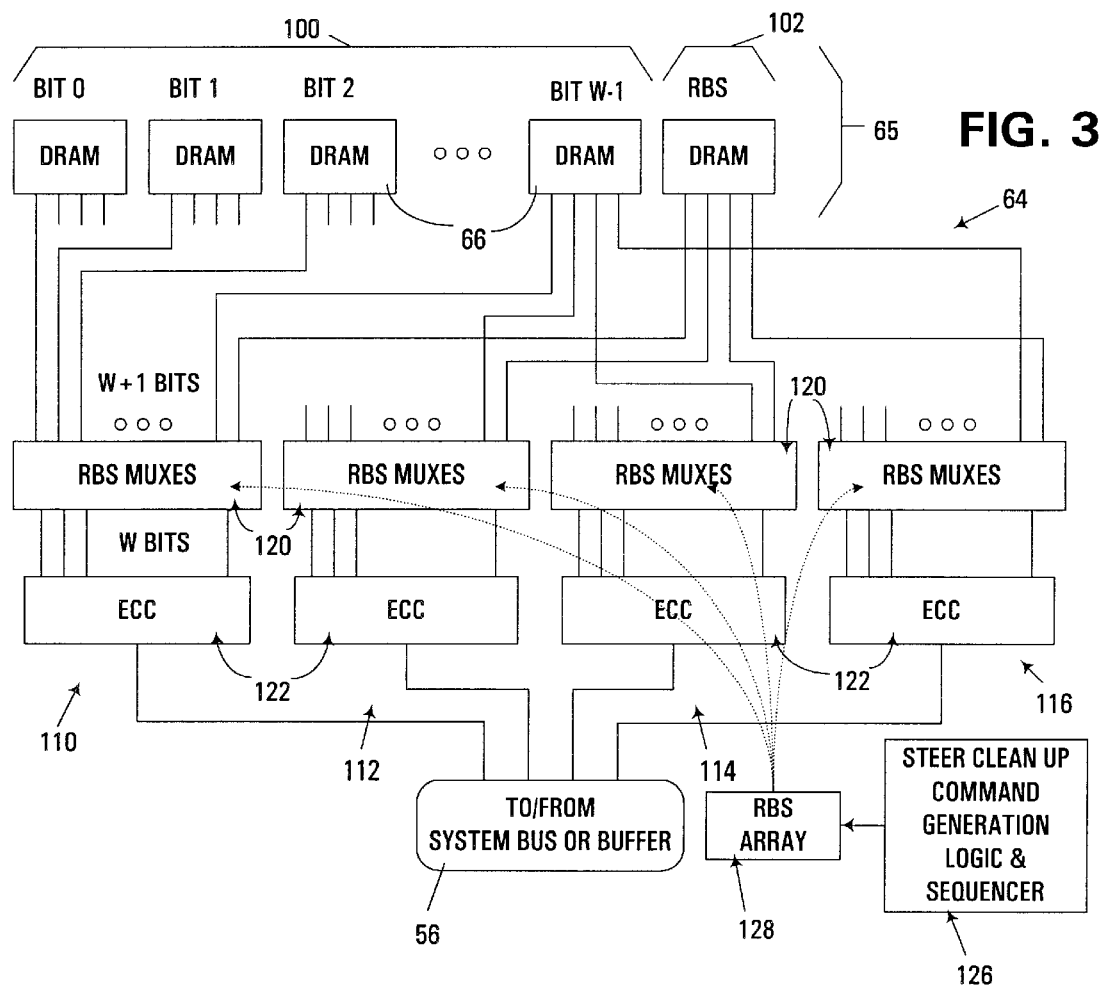
FIG. 3 is a block diagram illustrating the dataflow between the memory array and system bus of FIG. 2.

The dataflow of information between the system bus 56 and redundant memory array 65 is illustrated in greater detail in FIG. 3. In this implementation, redundant memory array 65 utilizes 4×DRAM devices 66, which include four separate input/output ports representing four different ECC words in the addressable memory space. The DRAM devices 66 are partitioned into primary memory devices 100, providing a total of W primary bits for any given memory location (where W is equivalent to the number of data bits and check bits stored at each memory location). Additionally, a redundant memory device 102 provides redundant storage to substitute a redundant bit (referred to as an RBS bit) for a failed bit allocated to one of the primary memory devices 100.

Memory controller 64 incorporates four data handling circuits 110, 112, 114 and 116 respectively configured to handle the four input/output lines coming from each memory device 66. Each circuit 110–116 includes an RBS multiplexer block 120 coupled to an ECC block 122.

RBS multiplexer block 120 receives the W bits of information from the primary DRAM devices, as well as an additional RBS bit from redundant device 102, thereby providing a total of W+1 bits of information. For fetch operations, each block 120 is utilized to select a subset of W bits of information from the W+1 incoming bits. For store operations, block 120 routes W bits received from ECC block 122 to the appropriate devices in the redundant memory array.

For fetch operations, ECC block 122 receives data from block 120 and performs an ECC detection and correction, outputting the corrected data to the system bus. For store operations, block 122 generates ECC data from information supplied over the system bus, and provides such data to block 120.

To implement the redundant memory array initialization as described herein, a steer clean up command generation logic and sequencer block 126 is utilized to store RBS data in an RBS array 128. The information in the array is then utilized to control the respective RBS multiplexer block 120 in each data handling circuit 110–116.

Figure 4:
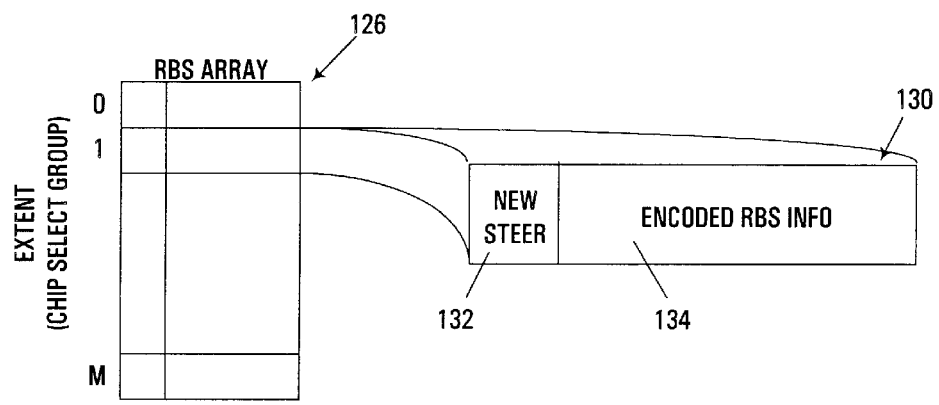
FIG. 4 is a block diagram of the RBS array of FIG. 3.

As shown in FIG. 4, RBS array 126 typically includes a plurality of entries 130, one for each supported extent, or chip select group provided in the redundant memory array. For example, for the implementation illustrated in FIG. 3, four array entries are supported for each extent.

Each entry in array 126 includes a new steer indicator field 132 and an encoded RBS information field 134. New steer indicator field 132 may represent a new steer (or initialization) indicator, for example, using a single bit, which indicates whether or not an initialization process is being performed in the associated extent. The encoded RBS information supports a binary value representing which of the W bits in the extent has failed and should be replaced with the redundant bit.

Since only one redundant memory device is supported per extent in the illustrated implementation, the encoded value can represent only a single bit to be replaced. In the alternative, the information in field 134 may be represented by a string of bits, each associated with a particular one of the primary data bits. This would permit multiple failed bits to be replaced with multiple redundant bits. In either implementation, a value that is not a valid bit encode in field 134 represents that the redundant memory device is not being used. Alternatively, a "valid" bit could be added as another field in each entry.

Figure 5:
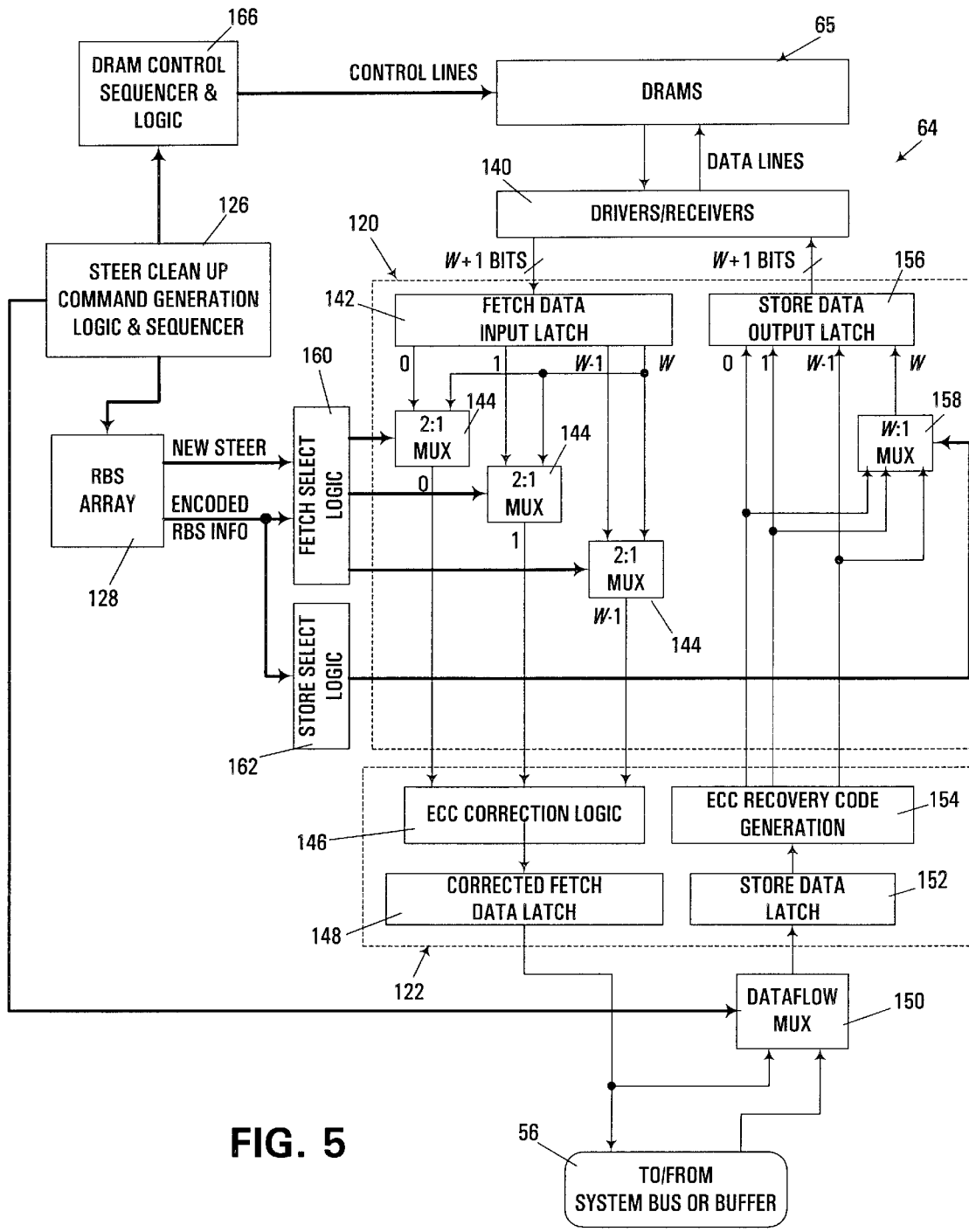
FIG. 5 is a block diagram of the redundant bit steering logic utilized in the memory controller of FIG. 2.

FIG. 5 illustrates the primary components in blocks 120 and 122 of one of the extents in FIG. 3 in greater detail. As illustrated in this figure, each RBS multiplexer block 120 is interfaced with memory array 65 through a set of drivers/receivers 140. Data fetched from the memory array is fed into a fetch data input latch 142. At this point, W+1 data bits, including the primary data bits and the redundant bit, are supplied to latch 142. Redundant bit steering is implemented using a series of 2:1 fetch multiplexers 144, each of which receives as input one of the primary data bits, as well as the redundant bit (shown provided as bit w). The outputs of multiplexers 144 are fed to ECC correction logic block 146 in ECC block 122. The multiplexers 144 reduce the total number of bits from W+1 to W, and the output of ECC correction logic block 146 is an ECC-corrected value that is supplied to a corrected fetch data latch 148, which in turn outputs to system bus 56. It will be appreciated that various ECC algorithms can be utilized consistent with the invention, and moreover, that the use and implementation of such ECC algorithms would be within the ability of one of ordinary skill in the art having the benefit of the instant disclosure.

For store operations, data is received from system bus 56 and supplied to one input of a dataflow multiplexer 150, the other input of which is coupled to the output of latch 148. Multiplexer 150 is a 2:1 multiplexer, and is under the control of a select signal that is capable of selectively routing either data from the system bus or ECC-corrected data stuffed in latch 148 to a store data latch 152 in block 122. The latched data is then supplied to an ECC recovery code generation block 154, which utilizes a complimentary algorithm to that implemented in block 146 to generate an ECC word, or recovery code, to be stored along with the data supplied by the system bus for error detection and correction.

Block 154 outputs W data lines to a stored data output latch 156, representing the primary data bits to be stored in the memory array. In addition, each of the data bits is supplied to a store multiplexer 158 having W inputs and capable of outputting one of such inputs to latch 156 as the redundant bit associated with the word output to the memory array. As such, store multiplexer 158 is capable of copying the primary data bit for a failed memory device to the redundant bit for storage in a redundant device. The output of latch 156 is supplied to drivers/receivers block 140, thereby providing an interface to memory array 65.

To perform initialization of a redundant memory device, steer clean up command generation logic in sequencer block 126 is interfaced to RBS array 128 to selectively store new steer and encoded RBS information in an RBS array entry associated with each extent of the memory array. To control fetch multiplexers 144, a fetch select logic block 160 is interposed between array 128 and each of fetch multiplexers 144. The encoded RBS information from the associated entry in RBS array 128 is also provided to a store select logic block 162 that controls store multiplexer 158 on the store side of block 120.

As discussed above, the encoded RBS information stored in an RBS array entry provides a binary representation of the primary data bit to be replaced by the redundant bit. As such, the encoded RBS information must be large enough to encode a value from 0 to W. A value other than 0 to W represents that no redundant bit steering should be performed.

Fetch select logic block 160 is configured to receive the encoded RBS information and decode such information into a select signal on one of W select lines to replace an incoming primary data bit on one of fetch multiplexers 144 with the redundant bit. Consistent with the invention, however, the decode operation occurs only when the new steer indicator is not asserted in the RBS array entry. When the new steer indicator is asserted, fetch select logic block 160 is configured to deassert all of the select signals for the fetch multiplexers 144 such that no redundant bit steering occurs on the fetch side of block 120. While other implementations may be used, one suitable implementation of block 160 would be a logic decoder having an AND gate coupled to each select line, and with the new steer bit coupled to a second input of each AND gate through an inverter to pass the select signal through only when the new steer bit is not asserted.

As discussed above, the new steer indicator is asserted while a redundant device is being initialized. As such, all non-initialization fetch operations initiated during initialization of a redundant device will use the data from the failed device.

Given that an encoded signal is required to control multiplexer 158, store select logic block 162 may simply be implemented as a latch, or may be omitted. However, it may be seen that, unlike block 160, block 162 is not responsive to the new steer indicator in the illustrated implementation. As such, non-initialization store operations are always directed to a redundant device whenever encoded RBS information is stored in the RBS array entry.

During initialization, block 126 also controls a DRAM control sequencer and logic block 166 coupled via a plurality of control lines to memory array 65 to control the memory array to sequentially fetch and store memory addresses within the failed extent. During each of such operations, block 126 also asserts the select line to multiplexer 150 to route data that has been fetched and corrected via the ECC logic back to latch 152 to copy the corrected data into the redundant device.

Figure 6:
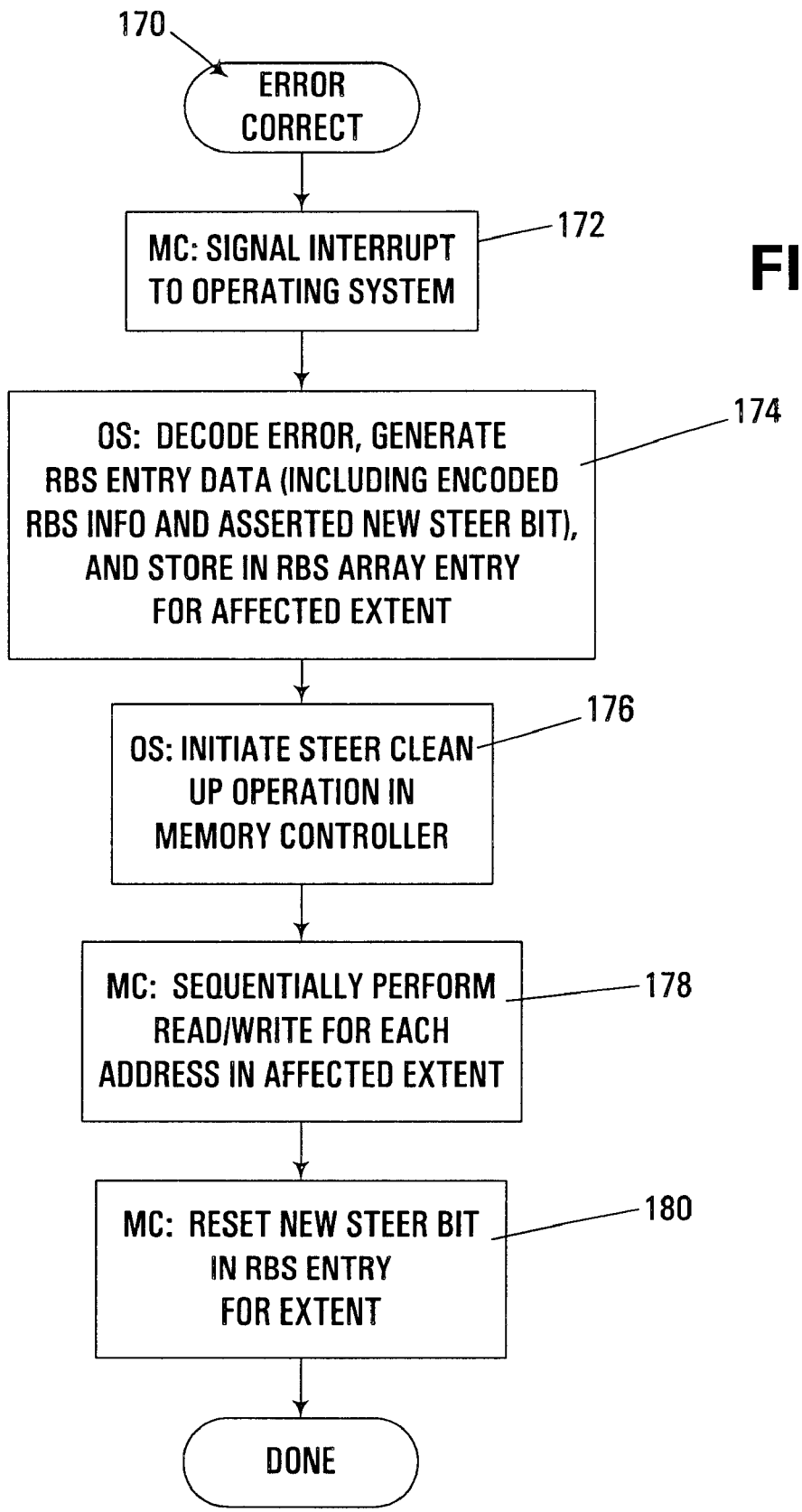
FIG. 6 is a flow chart illustrating the sequence of operations that occur during an error correction operation performed with the memory controller of FIG. 2.

The sequence of operations that occur during such initialization are illustrated by flow chart 170 of FIG. 6. The sequence of operations illustrated in this figure is typically initiated in response to detection of an error in the memory array by the memory controller. Detection of such errors is well known in the art, and the implementation thereof in a memory controller would be within the abilities of one of ordinary skill in the art having the benefit of the instant disclosure.

In response to such detection, the memory controller signals an interrupt to the operating system of the data processing system in block 172. In response, in block 174, the operating system decodes the error from the signaled interrupt, and generates appropriate RBS entry data (including the appropriate encoded RBS information, and with the new steer bit asserted), and stores such data in the RBS array entry for the extent affected by the error. Once the new RBS entry data is stored in the appropriate RBS entry, it will be appreciated that store operations are immediately redirected to the redundant device. However, by virtue of the assertion of the new steer indicator, fetch operations are still directed to the failed device.

Next, in block 176, the operating system initiates a steer clean up, or initialization, operation in the memory controller, e.g., by asserting an interrupt or a dedicated pin on the memory controller. In response to initiation of the clean up operation, the memory controller, and specifically block 126 of FIG. 5, sequentially performs a read/write operation for each address in the affected extent (block 178). As discussed above, by reading a memory address and immediately storing the data back to the same memory address, the ECC logic and the configuration of the RBS multiplexer block for that extent effectively copy the data from the failed device to the redundant device and thereby initialize the redundant device.

It should also be appreciated that during the performance of block 178, other non-initialization store and fetch operations may be received and processed in due course. Through the configuration of the RBS multiplexers, however, fetch operations are directed to the failed device, while store operations are directed to the redundant device.

Once each address in the affected extent has been copied, the memory controller next resets the new steer bit in the RBS entry associated with the extent (block 180). Upon deassertion of the indicator, the encoded RBS information stored in the entry is decoded by the fetch decode logic to effect switchover of fetch operations from the failed device to the redundant device. Initialization of the redundant device is then complete.

It will be appreciated that various modifications may be made to the above embodiments without departing from the spirit and scope of the invention. For example, rather than copying all of the data from a given extent, it may be desirable to copy only the portion of the data known to be defective.

The above-described embodiment provides a significant advantage in terms of reliability during initialization of a redundant device. As discussed above, for example, whenever a switchover occurs from a failed device to a redundant device without any prior clean up, there is a 0.5 probability that the data fetched will be correct, or at least correctable by the ECC logic. However, it has been found that with the herein-described implementation, the probability of obtaining uncorrectable data is significantly reduced, particularly in the common situation where the errors in a device are relatively small in proportion to the overall extent of the device. For example, should a 16 Mb device have only 1 Kb of faulty data, the probability of obtaining an uncorrectable error would drop from 0.5 to 0.0006.

Various additional modifications may be made to the illustrated embodiments without departing from the spirit and scope of the invention. Therefore, the invention lies in the claims hereinafter appended.

What is claimed is:

1. An apparatus, comprising:
   (a) a memory array including a plurality of memory devices; and
   (b) a memory controller coupled to the memory array, the memory controller configured to initialize a redundant memory device from the plurality of memory devices with data stored in a failed memory device from the plurality of memory devices by directing any non-initialization fetch operations associated with the failed memory device to the failed memory device, directing any non-initialization store operations associated with the failed memory device to the redundant memory device, and processing an initialization operation by copying data from the failed memory device to the redundant memory device.

2. The apparatus of claim 1, wherein the plurality of memory devices include a plurality of primary memory devices that include the failed memory device, each primary memory device including at least one data line configured to supply a primary data bit, wherein the redundant memory device includes at least one data line configured to supply a redundant data bit.

3. An apparatus, comprising:
   (a) a memory array including a plurality of memory devices; and
   (b) a memory controller coupled to the memory array, the memory controller configured to initialize a redundant memory device from the plurality of memory devices with data stored in a failed memory device from the plurality of memory devices by directing any non-initialization fetch operations associated with the failed memory device to the failed memory device non-initialization store operations associated with the failed memory device to the redundant memory device, and processing an initialization operation by copying data from the failed memory device to the redundant memory device, wherein the plurality of memory devices include a plurality of primary memory devices that include the failed memory device, each primary memory device including at least one data line configured to supply a primary data bit, wherein the redundant data bit, and wherein the memory controller includes:
      (i) a plurality of fetch multiplexers, each fetch multiplexer including first and second data inputs, a select input and an output, the first input coupled to receive the primary data bit from an associated primary memory device, the second input coupled to receive the redundant data bit from the redundant memory device, and the output configured to output either the primary data bit from the associated primary memory device or the redundant data bit responsive to a select signal provided to the select input;

(ii) a store multiplexer including a plurality of data inputs, a select input and an output, the output coupled to the data line from the redundant memory device, and the plurality of data inputs configured to receive a plurality of primary data bits forming a data word to be stored in the memory array; and (iii) selection logic coupled to the select inputs of the fetch and store multiplexers, the selection logic responsive to redundant bit steering information to drive the select input of the store multiplexer to control the store multiplexer to output the primary data bit associated with the failed memory device to the redundant memory device.

4. The apparatus of claim 3, wherein the selection logic is further responsive to an initialization indicator that indicates whether the redundant memory device is being initialized, wherein, when the initialization indicator indicates that the redundant memory device is being initialized, the selection logic is configured to drive the select input of each of the fetch multiplexers to control each fetch multiplexer to output the primary data bit from the associated primary memory device, and when the initialization indicator indicates that the redundant memory device is not being initialized, the selection logic is responsive to the redundant bit steering information to drive the select input of the fetch multiplexer associated with the failed memory device to control such fetch multiplexer to output the redundant data bit in lieu of the primary data bit associated with the failed memory device.

5. The apparatus of claim 4, wherein the memory controller further includes a redundant bit steering array including a plurality of entries, each entry associated with one of a plurality of extents defined in the memory array, and each entry storing an initialization indicator and redundant bit steering information for the associated extent.

6. The apparatus of claim 4, wherein the memory controller further includes:
(a) error correction logic coupled to the outputs of the fetch multiplexers, the error correction logic configured to generate a corrected fetch data word from the data bits output from the fetch multiplexers; and
(b) error recovery code generation logic configured to receive a store data word and generate therefrom an error recovery code, the error recovery code generation logic configured to output the store data word and the error recovery code to both the memory array and the store multiplexer.

7. The apparatus of claim 6, wherein the memory controller further includes initialization logic coupled to the selection logic and the memory array, the initialization logic configured to, responsive to detection of a failure in a primary memory device, generate redundant bit steering information identifying the failed memory device, assert the initialization indicator, initiate a plurality of fetch and store operations associated with the failed memory device to copy data from the failed memory device to the redundant memory device, and thereafter deassert the initialization indicator.

8. The apparatus of claim 1, wherein the memory controller is configured to direct any non-initialization fetch operations associated with the failed memory device to the failed memory device, and direct any non-initialization store operations associated with the failed memory device to the redundant memory device, during processing of the initialization operation.

9. A circuit arrangement for use in controlling a memory array including a plurality of memory devices, the circuit arrangement configured to initialize a redundant memory device from the plurality of memory devices with data stored in a failed memory device from the plurality of memory devices by directing any non-initialization fetch operations associated with the failed memory device to the failed memory device, directing any non-initialization store operations associated with the failed memory device to the redundant memory device, and processing an initialization operation by copying data from the failed memory device to the redundant memory device.

10. A memory controller comprising the circuit arrangement of claim 9.

11. A data processing system comprising the circuit arrangement of claim 9.

12. A program product, comprising a hardware definition program that defines the circuit arrangement of claim 9; and a computer readable media bearing the hardware definition program, wherein the computer readable media includes at least one of a transmission type media and a recordable media.

13. A method of initializing a redundant memory device in a memory array, the method comprising:
(a) processing an initialization operation for a redundant memory device by copying data from a failed memory device to the redundant memory device;
(b) directing any non-initialization fetch operations associated with the failed memory device to the failed memory device; and
(c) directing any non-initialization store operations associated with the failed memory device to the redundant memory device.

14. The method of claim 13, wherein directing any non-initialization fetch operations associated with the failed memory device to the failed memory device and directing any non-initialization store operations associated with the failed memory device to the redundant memory device are performed during processing of the initialization operation.

15. The method of claim 13, further comprising directing any non-initialization fetch operations associated with the failed memory device to the redundant memory device after processing of the initialization operation.

16. A method of initializing a redundant memory device in a memory array, the method comprising:
(a) processing an initialization operation for a device by copying data from a failed memory device to the redundant memory device;
(b) directing any non-initialization fetch operations associated with the failed memory device to the failed memory device;
(c) directing any non-initialization store operations associated with the failed memory device to the redundant memory device; and
(d) directing any non-initialization fetch operations associated with the failed memory device to the redundant memory device after processing of the initialization operation, and wherein:
(i) the memory array includes a plurality of primary memory devices that include the failed memory device, each primary memory device including at least one data line configured to supply a primary data bit, wherein the redundant memory device includes at least one data line configured to supply a redundant data bit;

(ii) directing any non-initialization fetch operations associated with the failed memory device to the redundant memory device after processing of the initialization operation includes controlling the select inputs of a plurality of fetch multiplexers, each fetch multiplexer including the select input, first and second data inputs, and an output, the first data input coupled to receive the primary data bit from an associated primary memory device, the second data input coupled to receive the redundant data bit from the redundant memory device; and (iii) directing any non-initialization store operations associated with the failed memory device to the redundant memory device includes controlling the select input of a store multiplexer including the select input, a plurality of data inputs, and an output, the output coupled to the data line from the redundant memory device, and the plurality of data inputs configured to receive a plurality of primary data bits forming data word to be stored in the memory array.

17. The method of claim 16, wherein:
(a) directing any non-initialization fetch operations associated with the failed memory device to the failed memory device includes driving the select input of each of the fetch multiplexers to control each fetch multiplexer to output the primary data bit from the associated primary memory device; and
(b) directing any non-initialization fetch operations associated with the failed memory device to the redundant memory device after processing of the initialization operation includes driving the select input of the fetch multiplexer associated with the failed memory device to control such fetch multiplexer to output the redundant data bit in lieu of the primary data bit associated with the failed memory device.

18. The method of claim 17, further comprising determining whether processing of the initialization operation is complete by polling an initialization indicator.

19. The method of claim 17, wherein copying data from the failed memory device to the redundant memory device includes:
(a) fetching data from the memory array;
(b) processing the fetched data using error correction code (ECC) logic to generate error corrected data; and
(c) storing the error corrected data back into the memory array.

20. A method of initializing a redundant memory device in a memory array, the method comprising:
(a) copying data from a failed memory device to a redundant memory device;
(b) receiving non-initialization store and fetch operations during the copying of data from the failed memory device to the redundant memory device;
(c) prior to completing the copying of data from the failed memory device to the redundant memory device, redirecting each received non-initialization store operation associated with the failed memory device from the failed memory device to the redundant memory device; and
(d) after completing the copying of data from the failed memory device to the redundant memory device, redirecting each received non-initialization fetch operation associated with the failed memory device from the failed memory device to the redundant memory device.

21. The method of claim 20, wherein, prior to completing the copying of data from the failed memory device to the redundant memory device, received non-initialization fetch operations associated with the failed memory device are directed to the failed memory device.

* * * * *

UNITED STATES PATENT AND TRADEMARK OFFICE
CERTIFICATE OF CORRECTION

PATENT NO.    : 6,505,306 B1
DATED         : January 7, 2003
INVENTOR(S)   : Herman Lee Blackmon et al.

It is certified that error appears in the above-identified patent and that said Letters Patent is hereby corrected as shown below:

Column 10,
Line 49, after "memory device" (second occurrence) insert -- directing any --.
Line 59, after "dant" insert -- memory device includes at least one data line configured to supply a redundant --.

Column 12,
Line 48, after "a" insert -- redundant memory --.

Signed and Sealed this

Thirty-first Day of August, 2004

JON W. DUDAS
*Director of the United States Patent and Trademark Office*